United States Patent [19]

Oswald

[11] 4,214,279
[45] Jul. 22, 1980

[54] CLOCKING SYSTEM FOR SERVO SIGNAL HAVING TWO OR MORE HARMONICALLY RELATED FREQUENCIES

[75] Inventor: Richard K. Oswald, San Jose, Calif.

[73] Assignee: International Business Machines Corporation, Armonk, N.Y.

[21] Appl. No.: 6,403

[22] Filed: Jan. 25, 1979

[51] Int. Cl.² .................. G11B 5/09; G11B 21/10
[52] U.S. Cl. ........................................ 360/51; 360/78
[58] Field of Search ............................ 360/51, 77, 78

[56] References Cited
U.S. PATENT DOCUMENTS

| 3,534,344 | 10/1970 | Santana ................................. 360/77 |
| 3,879,753 | 5/1975 | Dunn ..................................... 360/77 |
| 4,092,683 | 5/1978 | Andrews, Jr. et al. ................. 360/77 |

Primary Examiner—Vincent P. Canney
Attorney, Agent, or Firm—R. E. Cummins

[57] ABSTRACT

This invention is directed to a system for generating clock signals from a source signal having two harmonically related and phase coherent frequencies such as shown in U.S. Pat. No. 3,534,344 (Santana) and U.S. Pat. No. 3,879,753 (Dunn). The clock system employs a pair of synchronous demodulators for generating a phase error signal to control a voltage controlled oscillator (VCO). The source signal is applied to a pair of synchronous demodulators, each of which is supplied with a different carrier frequency. The output of each demodulator represents the area of the signal being demodulated. The output of each demodulator is zero and a null condition exists when the system is in a phase locked condition. At a non-locked condition, the output of one demodulator has multiple null points. The function of the second demodulator is to resolve the ambiguity between the desired and undesired null points. Carrier signals are generated under control of the VCO by dividing the output of the VCO signal to obtain carrier signals having the appropriate relationship to the source signal.

7 Claims, 8 Drawing Figures

CLOCKING SYSTEM FOR SERVO SIGNAL HAVING TWO OR MORE HARMONICALLY RELATED FREQUENCIES

DESCRIPTION

1. Technical Field

This invention is directed to a system for generating a clock signal from an input signal consisting of two or more harmonically related and phase coherent frequencies. In the disclosed embodiment, the input signal is derived from a servo transducer of a position control servo system in a magnetic disk file by scanning a servo pattern which has been prerecorded on a disk. The prerecorded servo pattern and resulting dipulse signal correspond to the servo pattern and signals described in U.S. Pat. No. 3,534,344 (Santana) and U.S. Pat. No. 3,879,753 (Dunn).

The clock generating system employs synchronous demodulators for generating a phase error signal to vary the phase of a voltage controlled oscillator relative to the input signal. Different carrier signals, generated from the output of the VCO, are applied to the other inputs of the demodulators so that the demodulated signals represent the areas of the signals being demodulated. At a lock condition, the output of each demodulator is zero. In a non-locked condition, one demodulator has three null points. The output of the second demodulator is employed to resolve the ambiguity between the two undesired null points and the one correct null point.

The system of the present invention allows clock phase alignment to be determined by the areas in all of the position information which has been prerecorded without providing special characters or second level gating in the demodulator, or a separate clock track.

Also, since all the logic signals have 50% duty cycles, there is no problem with DC output offset as a result of demodulator bias current sources becoming unbalanced.

It is, therefore, an object of the present invention to provide an improved system for generating clocking signals from a source signal having two harmonically and phase coherent frequencies.

Another object of the present invention is to provide a clock generating system for a magnetic disk file in which all of the prerecorded servo position information is employed in the generation of the clock signal.

A further object of the present invention is to provide a clock generating system for a magnetic disk file in which clock alignment is determined by the area of the prerecorded dipulse servo signal.

DISCLOSURE OF INVENTION

Figure 1:
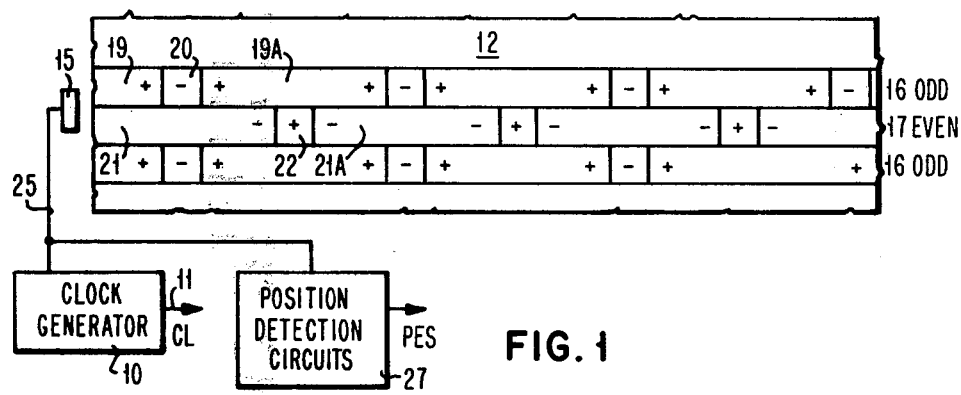
FIG. 1 is a diagrammatic showing of a magnetic transducer scanning a portion of a prerecorded servo pattern on a magnetic disk.

As shown in FIG. 1, the clock generator 10 is employed to provide a clock signal at its output 11 in response to an input signal generated by scanning a servo pattern 12 prerecorded on a magnetic disk of a disk storage file. The pattern shown in FIG. 1 is disclosed in U.S. Pat. No. 3,534,344, FIG. 2, and represents a portion of a plurality of concentric contiguous servo tracks which are generally prerecorded on one disk of a magnetic disk storage file.

As is known in the art, the boundary between servo tracks defines the center line of an associated data track on a related data disk and the signal generated by the servo transducer is used to generate a position error signal for the transducer positioning control system of the disk file. The pattern shown in FIG. 1 is referred to in the art as the "dipulse" pattern in that the signal generated therefrom by a magnetic transducer centered over the boundary produces a signal consisting of a series of alternating individually distinguishable dipulse wave shapes consisting of pulses A and B, and C and D, as shown in FIG. 2A.

As shown, the pattern consists of odd and even tracks 16 and 17, respectively. The odd track 16, as shown, comprises an area 19 magnetized in the plus direction, an area 20 magnetized in the opposite direction followed by another area 19A magnetized in the plus direction. This plus-minus-plus pattern is repeated around the length of the track 16. The even track 17 comprises an area 21 magnetized in the negative direction followed by an area 22 magnetized in the plus direction followed by another area 21A magnetized in the negative direction. This pattern is also repeated around the length of the even track. The lengths of areas 19 and 21 are identical, as are the lengths of areas 20 and 22. An even track pattern is shifted relative to the odd track pattern such that the distance between the plus to minus transistion between area 19 and 20 and the minus to plus transistion between area 21 and 22 in the adjacent track is one-half the distance between the corresponding plus to minus transistions in the odd track 16.

Figure 2:
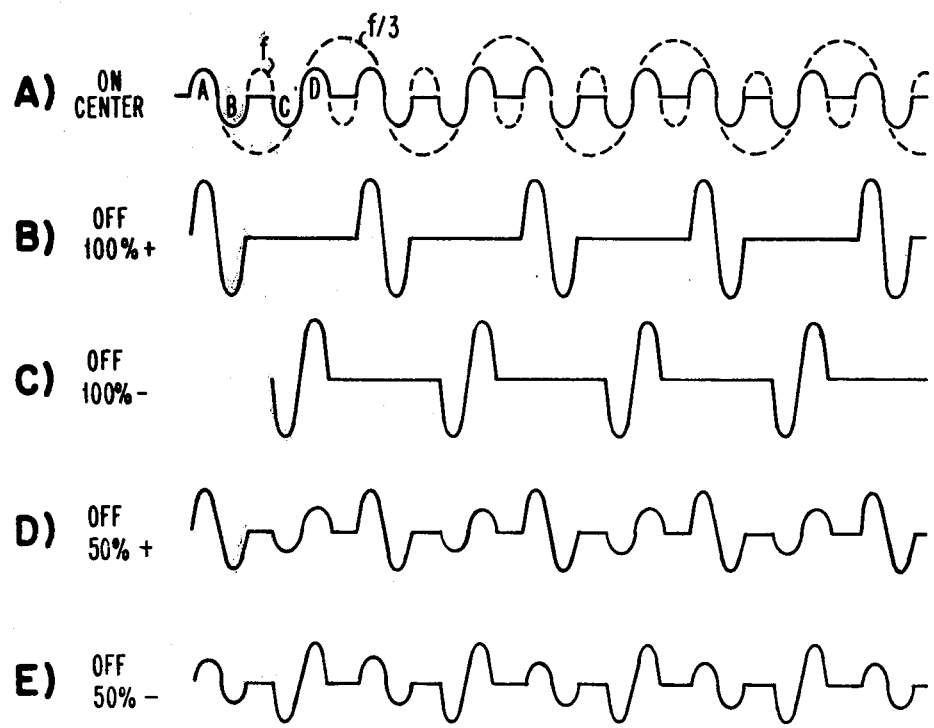
FIGS. 2A through 2E illustrate the signals generated by the transducer shown in FIG. 1 for different positions of the transducer relative to the boundary of the two adjacent servo tracks.

The resulting signal on line 25 generated by transducer 15, therefore, has two harmonically related frequency components f and f/3 which are shown in dotted line form in FIG. 2 and superimposed on the actual signal from transducer 15. These signals are phase coherent.

The signal from transducer 15 is basically employed as a position information signal in that the dipulse signal is supplied to suitable position detection circuitry 27, as explained in the above mentioned patent, to provide both direction information and information relative to the distance that the transducer is off-center.

As shown in FIG. 1, the present invention is designed to extract clocking information from the dipulse signal regardless of the position of the magnetic transducer relative to the center line of the odd-even track boundary when the position control system is in the track following mode, and also provide the clocking signal during a seek operation of the position control system when the head is moving rapidly transversely of the odd-even tracks.

FIGS. 2B through 2E illustrate signals representing various positions of the head relative to the boundary between adjacent servo tracks. It will be seen in FIGS. 2B and 2C that when the head is completely centered over a servo track, one portion of the dipulse pattern is missing.

Figure 3:
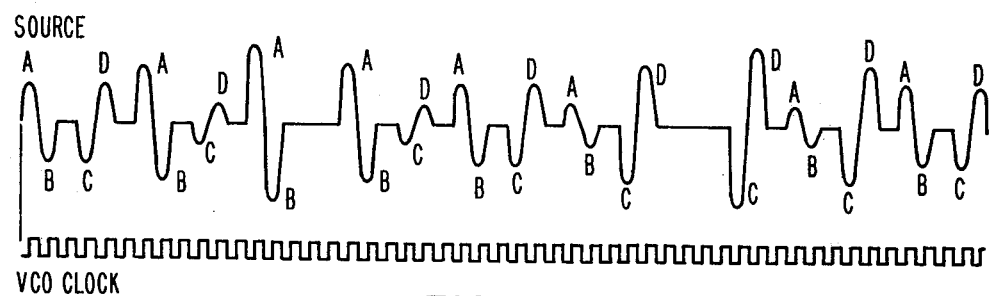
FIG. 3 illustrates the output of the transducer as the transducer is moved radially from one odd track to the next odd track of the prerecorded servo tracks and the main clock signal which is to be generated by the VCO.

FIG. 3 illustrates how the wave shape of input signal changes as transducer 15 is moved across a series of tracks and how the clock signal is phase locked to the incoming signal. It should be realized that the wave shapes, as shown, are idealized and since the transducer-disk system is not perfect, the wave shapes in practice will be degraded to various degrees.

Figure 4:
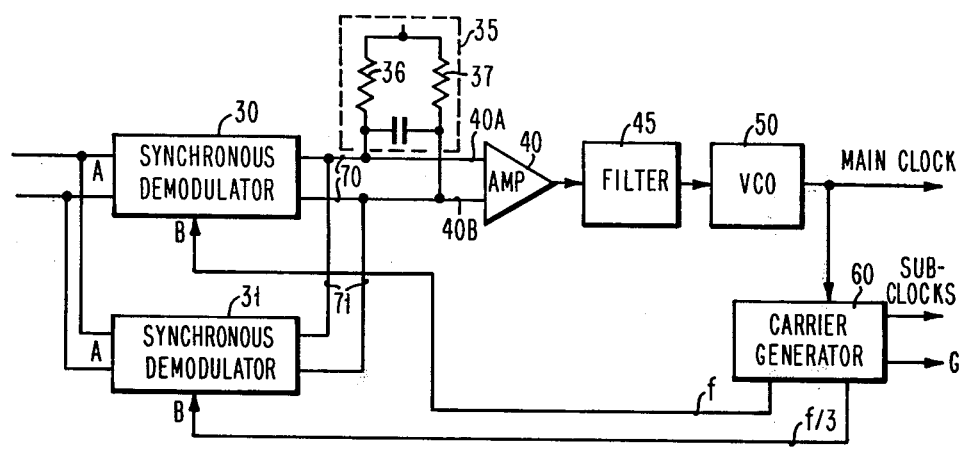
FIG. 4 is a block diagram of the improved clocking generator.
Figure 5:
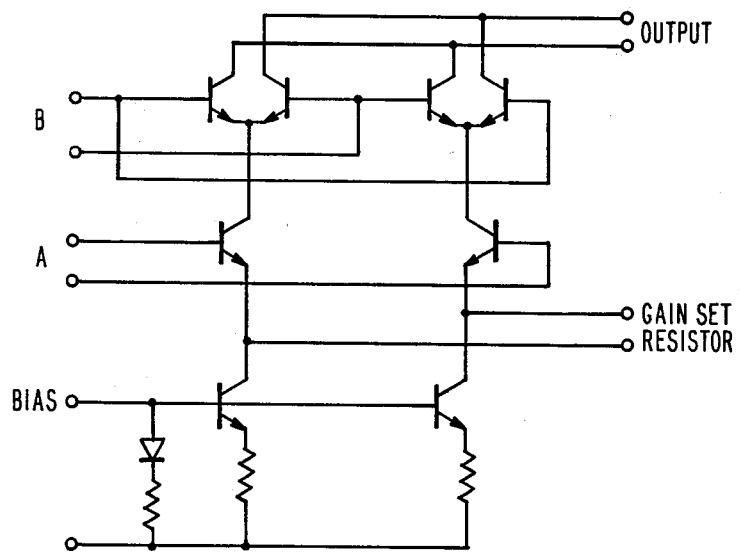
FIG. 5 is a schematic of the demodulator shown in FIG. 4.

The clock generator 10 of FIG. 1 is shown in schematic block form in FIG. 4. As shown in FIG. 4, the clock generator comprises a pair of synchronous demodulators 30, 31. Each demodulator 30, 31 has a first input A and a second input B. The input signal provided by the magnetic transducer is applied to each input A. A different predetermined carrier signal is applied to each terminal B of demodulators 30, 31. The function and operation of the synchronous demodulator is well known in the art and, hence, a detailed explanation is not warranted. FIG. 5 illustrates the circuit details of one prior art synchronous demodulator which may be employed for the boxes labelled 30 and 31 in FIG. 4 with the inputs identified as shown in FIG. 4.

Figure 6:
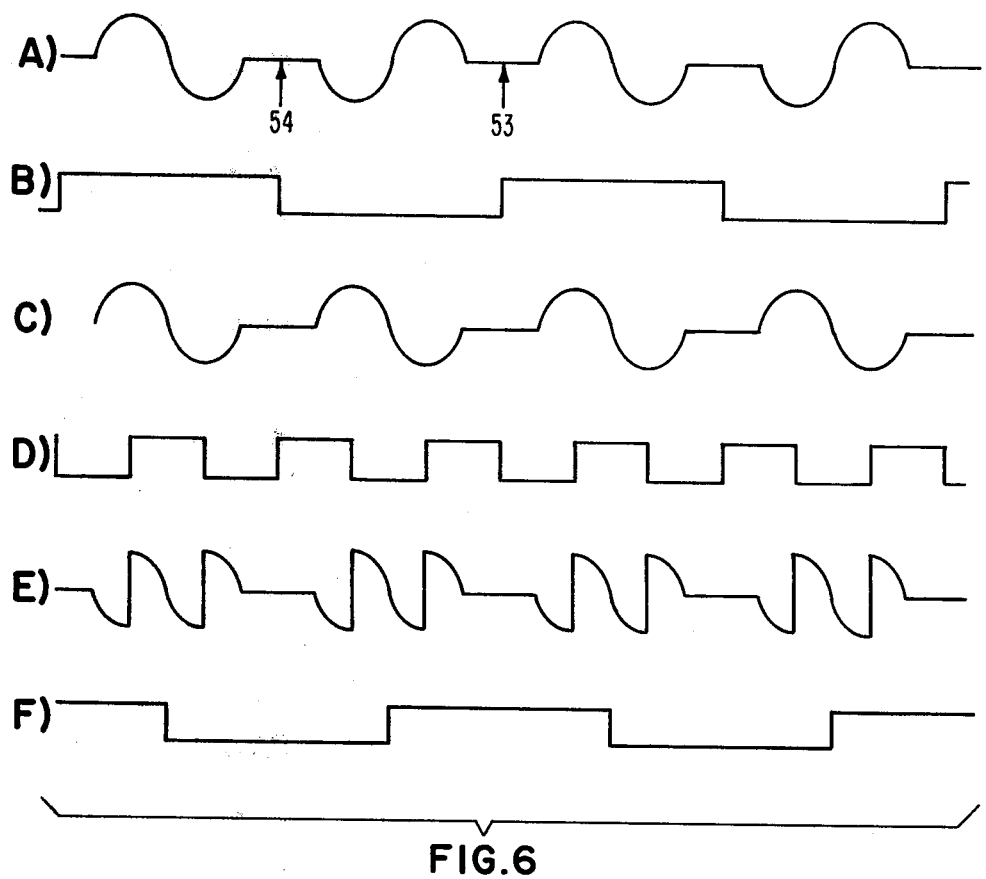
FIG. 6, including A-F, illustrates various waveforms which appear at various points in the system shown in FIG. 4 during a lock condition.

In general, the output signal of the synchronous demodulator represents the product of the two input signals. In the present case where the carrier signals are square waves, the output signal is proportional to the input signal when the sign of the carrier signal is positive. When the sign of the carrier signal is negative, the phase of the input signal on input A is reversed by 180° in the output signal. This is illustrated in FIG. 6, for example, by signals C and E.

The clock generator further comprises a difference amplifier 40 whose function is to generate a phase error signal which corresponds to the algebraic difference between the differential outputs of both synchronous demodulators 30, 31. Since the output signals of the demodulators represent the areas of the respective pulses A, B, C, and D, of the input signal, the phase error signal corresponds to the difference in areas of output signals of the demodulators 30, 31.

A capacitor resistive network 35 consisting of load resistors 36 and 37 is connected across the input terminals 40A and 40B of difference amplifier 40. The function of circuit 35 is to average and smooth the ripple components of the output currents of the demodulators so that the output of amplifier 40 will be essentially a DC voltage.

The output of the difference amplifier 40 is connected to the voltage controlled oscillator (VCO) 50 through a suitable loop filter 45 to compensate the loop frequency response so as to insure both stability and sufficiently small steady state phase error. VCO 50 has a nominal frequency of, for example, 6 megahertz.

The clock generator 10 further comprises means for generating the two different carrier frequencies f and f/3. The carrier generator 60 is shown in block form in that any suitable "divide by N" arrangement known in the art may be employed. In the illustrated embodiment, carrier generator 60 divides the output of VCO by two to provide the carrier signal f of 3 megahertz to demodulator 30 and by six to provide the carrier f/3 signal of 1 megahertz to synchronous demodulator 31. The carrier generator 60 may also provide a subclock signal of any suitable multiple of the 6 megahertz clock from the VCO 50.

The operation of the clock generator 10 and the manner of controlling the VCO so that it becomes locked onto the input signal and is maintained in phase with the input signal will now be described in connection with FIGS. 6 and 7, which illustrate signals in the clock generator 10 at various points, and in connection with FIG. 8 which illustrates how demodulator 31 cooperates with demodulator 30 to cause the system to be phase locked at the correct lock point.

FIG. 6A illustrates the signal generated by transducer 15 when the transducer is centered over the boundary between adjacent servo tracks. The remaining wave forms, as shown, represent the lock condition. FIG. 6D shows the carrier signal applied to demodulator 30, while FIG. 6B shows the carrier signal f/3 applied to demodulator 31. The phase relationship of signals A, B and D at lock is that positive going edges of signal B align with negative going edges of signal D and the center of the space where the missing negative half cycle of Signal A would be, indicated by arrow 53 in FIG. 6A; the negative going edges of signal B align with positive going edges of signal D and the center of the space where the missing positive half cycle of signal A would be, indicated by arrow 54.

Signal C represents the output of demodulator 31, while signal E represents the output of demodulator 30. Differential signals C and E are both applied to load resistors 36 and 37 of the ripple filtering network 35. The net effect is a zero phase error voltage at the output of difference amplifier 40, since terminals 40A and 40B of amplifier 40 will be at the same potential.

Signal F of FIG. 6 represents subclock signal at frequency f/3 which may be generated by dividing down the output of VCO by a factor of six. Under the assumption of the previous example, signal B has a frequency of 1 megahertz and signal D has a frequency of 3 megahertz and the VCO has a nominal frequency of 6 megahertz.

Figure 7:
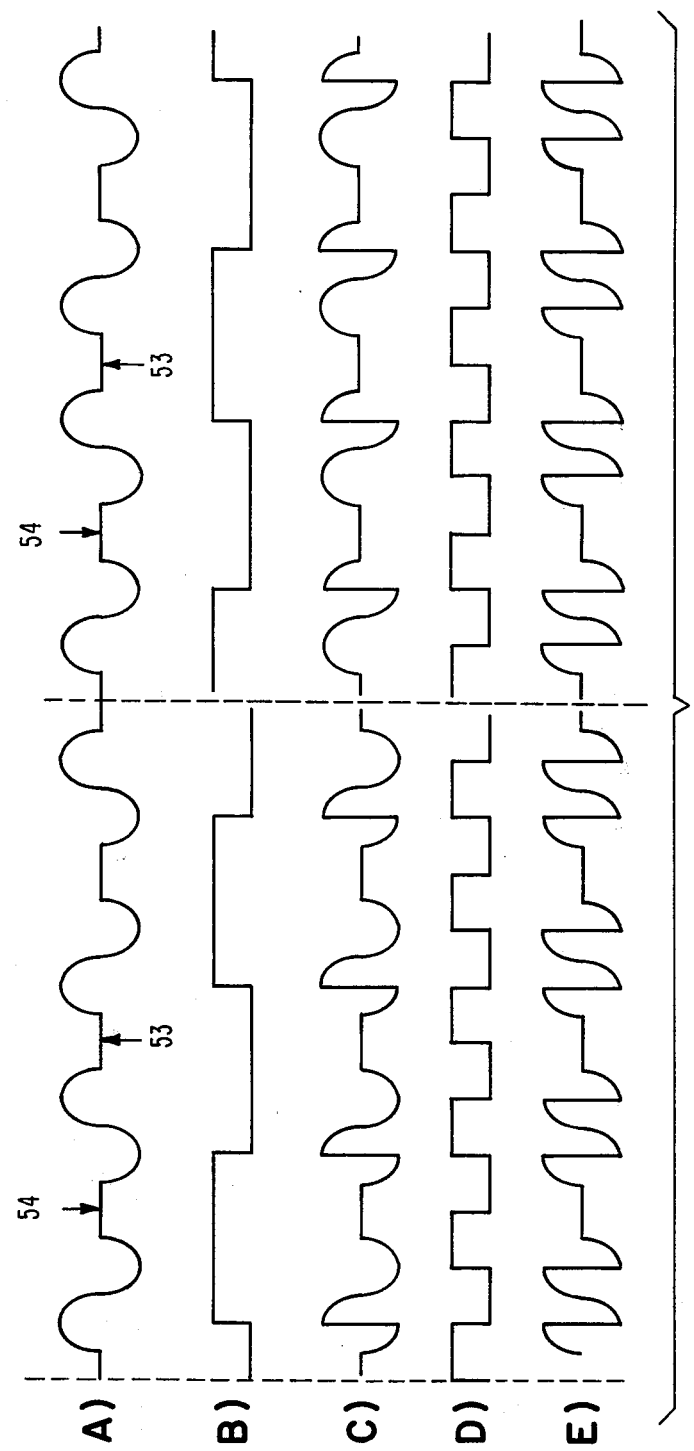
FIG. 7, including A-E, illustrates various waveforms which appear in the system shown in FIG. 4 when the system is not in a lock condition.

FIG. 7 is similar to FIG. 6 and illustrates two conditions where the VCO is not locked to the input signal. The signals on the lefthand portion of FIG. 7 represent the condition where the input signal 7A is 60° out of phase relative to the carrier signal B, or 180° out of phase relative to the carrier signal D. The 60° lagging relationship can be readily seen by comparing the lock points 53 and 54 of signal A with the negative and positive going transistions of signal B.

The righthand portion of FIG. 7 illustrates a similar condition where signal B is also 60° out of phase relative to the input signal, but in the opposite direction.

By examining signals 7C and 7E for both conditions, it will be seen how the phase error voltage is generated since there is a non-zero area in the pulses supplied to load resistors 36 and 37 in a fixed time period. Stated differently, if during the period defined by arrows 53 and 54 in signal A, the areas of the positive pulses in signals C and E are summed and at the same time the areas of the negative pulses are also summed, it will be seen that the ratio is 3 positive to 5 negative, one unit being equal to one-quarter of a sine wave pulse. The input to the difference amplifier 40 represents a value of 2, which is supplied as a correction voltage to adjust the phase of the VCO relative to the input signal.

A similar exercise for the corresponding signals in the righthand portion of FIG. 7 shows a ratio of 5 positive to 3 negative and a correction value of 2 in the opposite sense being supplied to the difference amplifier 40 and the VCO.

Figure 8:
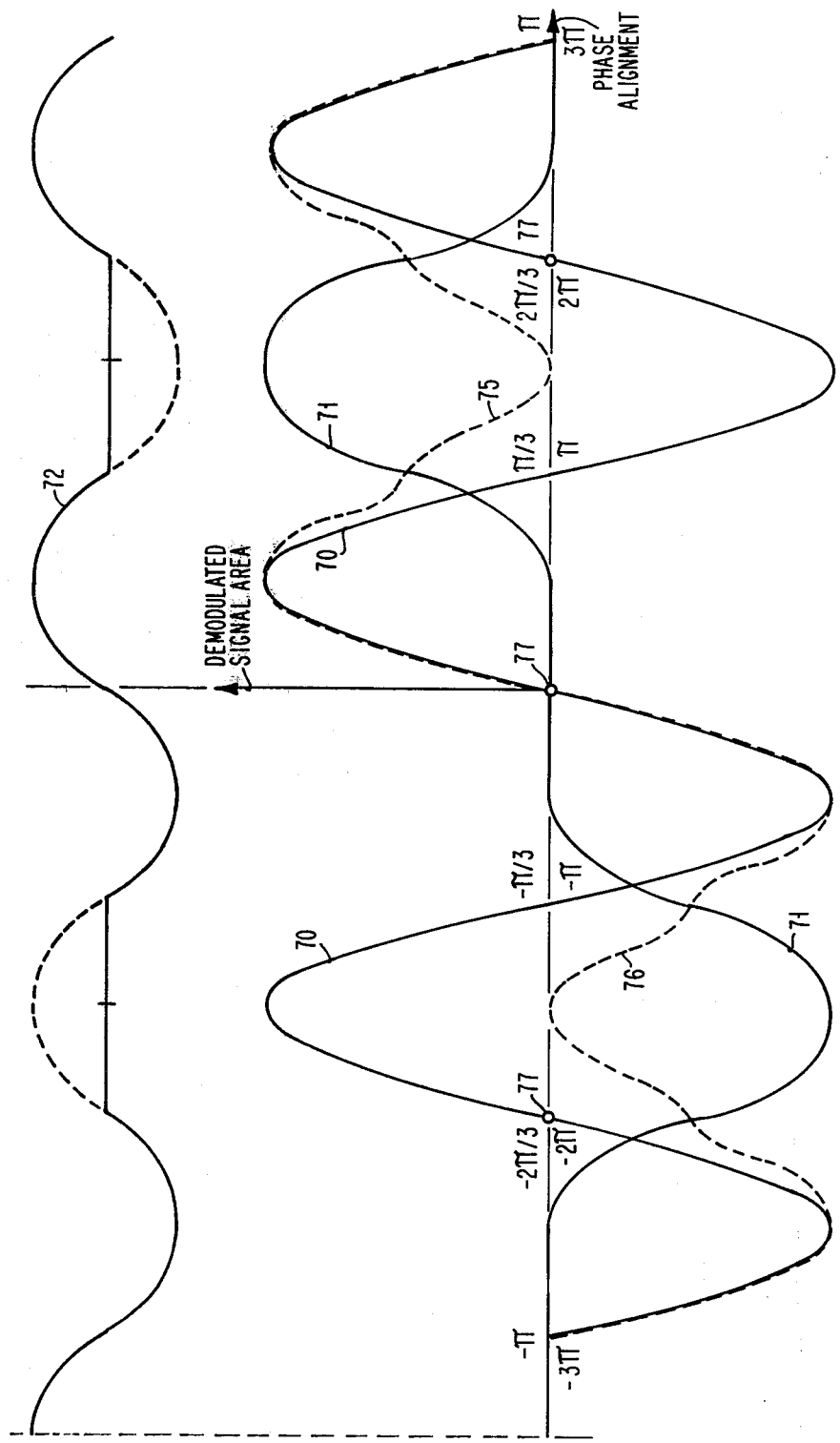
FIG. 8 is a phase diagram showing the three lock points as the phase of the input signal changes relative to the phase of the voltage controlled oscillator.

FIG. 8 is a phase diagram showing the magnitude of demodulator output for various phase alignments between signal 25 and the clock generator 10 of FIG. 1. Curve 70 corresponds to carrier f of three megahertz supplied to demodulator 30. Curve 71 corresponds to the carrier f/3 supplied to demodulator 31. The input signal 72 from the transducer is shown on the same scale. The X axis represents relative phase and two scales are indicated for the respective signals 70 and 71.

As can be seen from FIG. 8, if demodulator 30 were used alone, lock points 77 could occur at $+2\pi$ and $-2\pi$ as well as at 0, as desired. But when both demodulators 30 and 31 are used and their outputs summed, the result is curve 75 which has only the desired lock point at 0.

While the invention has been particularly shown and described with reference to a preferred embodiment thereof, it will be understood by those skilled in the art that various changes in the form and details may be made therein without departing from the spirit and scope of the invention.

Having thus described my invention, what I claim as new and desire to secure by Letters Patent is:

1. A system for generating a clock signal from a source signal having at least two harmonically related and phase coherent frequencies, said clock signal having a frequency corresponding to a multiple of one of said two related frequencies and being phase locked to the lower of said two related frequencies, said system comprising:

(a) a voltage controlled oscillator (VCO) having a nominal frequency a multiple of said lower frequency and a control terminal for receiving a phase error signal to vary said nominal frequency, said phase error signal representing the instantaneous phase error between the output of said voltage controlled oscillator and said source signal relative to a predetermined lock point;

(b) means for generating said phase error signal comprising:
        (1) first and second synchronous demodulators, each having a first input for receiving said source signal, a second input for receiving a carrier signal, and an output, each said synchronous demodulator generating a signal at its output representing the total energy contained in portions of said source signal supplied to said input, which portions are selected by the carrier signal supplied to said second input;
        (2) means connected between the output of said VCO and said second inputs of said synchronous demodulators for generating first and second carrier signals at frequencies corresponding respectively to said two harmonically related frequencies of said source signal;
        (3) and means connected between the outputs of said synchronous demodulators and the control input of said VCO to combine said output signals of said demodulators to provide said phase error signal.

2. The combination recited by claim 1 in which said source signal corresponds to the signal generated by relative movement between a magnetic servo transducer and a servo pattern prerecorded on a magnetic surface.

3. The combination recited by claim 2 in which said magnetic surface is the surface of a magnetic disk on which said servo pattern is recorded and consists of a plurality of concentric servo tracks.

4. The combination recited by claim 1 in which said two harmonically related frequencies of said source signal are the first and third harmonic.

5. The combination recited by claim 4 in which said carrier signals comprise substantially square wave pulses.

6. The combination recited by claim 5 in which said combining means comprises a differential amplifier and means to average the respective outputs of said synchronous demodulators to provide inputs to said differential amplifier.

7. The combination recited by claim 6 in which said carrier generator means includes means for dividing the output signal of said voltage controlled oscillator by predetermined multiples to provide first and second carrier signals.

* * * * *